United States Patent [19]
Machida

[11] Patent Number: 5,631,560
[45] Date of Patent: May 20, 1997

[54] MAGNETIC RESONANCE IMAGING APPARATUS

[75] Inventor: Yoshio Machida, Tochigi-ken, Japan

[73] Assignee: Kabushiki Kaisha Toshiba, Kanagawa-ken, Japan

[21] Appl. No.: 511,605

[22] Filed: Aug. 4, 1995

[30] Foreign Application Priority Data

Aug. 8, 1994 [JP] Japan ................................. 6-185910
Jul. 26, 1995 [JP] Japan ................................. 7-190459

[51] Int. Cl.$^6$ ................................. G01V 3/00
[52] U.S. Cl. ................................. 324/309; 324/306
[58] Field of Search ................................. 324/309, 307, 324/306, 311, 312, 300

[56] References Cited

U.S. PATENT DOCUMENTS

| | | | |
|---|---|---|---|
| 5,167,232 | 12/1992 | Parker et al. | 324/309 |
| 5,168,226 | 12/1992 | Hinks | 324/309 |
| 5,237,273 | 8/1993 | Plewes et al. | 324/309 |
| 5,352,980 | 10/1994 | Machida | 324/307 |
| 5,406,203 | 4/1995 | Oh et al. | 324/309 |
| 5,438,263 | 8/1995 | Dworkin et al. | 324/309 |

OTHER PUBLICATIONS

"Interacranial MR Angiography: A Direct comparison of Three Time-of-flight Techniques" Jonathan S. Lewis and Gerhard Laub; AJR 158, pp. 381–387, Feb. 1992.

"Helical Scan for Time Resolved MRI at 0.5T" Volker Rasche, Roland Proksa, Dietrich Holz and W. Schepper Abstruct Book of SMRM'93, p. 479.

"The Design of Variable Tip Angle Slab Selection (Tone) Pulses for Improved 3–D MR Angiography", D. Purdy, G. Cadena, and G. Laub; Abstract Book of SMRM'92, p. 882.

Primary Examiner—Louis M. Arana
Attorney, Agent, or Firm—Limbach & Limbach LLP; Ronald L. Yin

[57] ABSTRACT

A magnetic resonance imaging apparatus selectively excites a three-dimensional predetermined region called a slab and gives phase encode information and frequency encode information to magnetic resonance signals generated from the slab. Signals are acquired from a whole imaging region while the slab is slightly moved in a slice direction. The acquired signals are subjected to a Fourier-transformation in the slice direction. From the result of the Fourier transform, components acquired in the flat portion of the selective excitation characteristic are extracted. These signal components are arranged in accordance with the signal acquisition positions in the slice direction. Image reconstruction in the two remaining directions (the phase encode and the read directions) is then performed to obtain a final image.

18 Claims, 5 Drawing Sheets

MAGNETIC RESONANCE IMAGING APPARATUS

BACKGROUND OF THE INVENTION

1. Field of the Invention

The present invention relates to a magnetic resonance imaging apparatus (to be abbreviated as an MRI apparatus hereinafter) and, more particularly, to an MRI apparatus for imaging a large number of slices or slabs.

2. Description of the Related Art

Generally, an MRI apparatus selectively excites a predetermined region called a slice (two-dimensional region) or a slab (three-dimensional region) at once, adds phase information corresponding to the position of spins to a magnetic resonance signal (MR signal) generated from the whole selective excitation region (this process is called encode), and repetitively acquires the MR signals while changing the encode amount. When the signal acquisition of one region is completed, the apparatus acquires MR signals of an overall region to be imaged while changing the selective excitation region. This imaging method is called a sequential multi-slice imaging method or a sequential multi-slab imaging method. The apparatus then performs reconstruction processing for the acquired MR signals, i.e., performs two-dimensional Fourier transform for each slice, or three-dimensional Fourier transform for each slab, thereby reconstructing a two-dimensional or three-dimensional image.

To efficiently acquire MR signals from a wide region, a so-called multi-slice imaging method or multi-slab imaging method has been developed in which, during a repetition time TR for a certain slice, signals from a large number of other slices or slabs are acquired.

Regardless of whether the method is a simple sequential multi-slice or multi-slab imaging method or a so-called multi-slice or multi-slab imaging method, images are reconstructed in units of selective excited regions (slices or slabs) on the basis of the signals acquired from these excited regions.

It is unfortunate that the above conventional imaging methods have the following drawback. That is, in imaging a sagittal image or a coronal image which is long in the body-axis direction, a difference is produced in the signal intensity between imaging regions neighboring along the body-axis direction. This results in a discontinuous signal intensity near the boundary, leading to a nonuniform image quality. Especially when MR angiography is performed using the multi-slab imaging method or the sequential multi-slab imaging method, the blood flow signal intensity decreases due to a saturation effect on the downstream side of the blood flow in each slab. Consequently, the signal intensity becomes discontinuous in the boundary between the slabs, and the brightness of the blood flow image also becomes discontinuous in the resulting MR angiography accordingly.

On the other hand, a method has been proposed in which signals in a broad range along the direction perpendicular to the slice are efficiently acquired in a manner similar to helical scan of an X-ray CT apparatus which gradually moves the slice position ("Helical Scan for Time Resolved MRI at 0.5 T", V. Rasche et al., Abstract Book of SMRM '93, p. 479).

Unfortunately, this method reconstructs an image by approximately or virtually calculating an MR signal of a virtual slice, and hence does not accurately reflect information in the slice direction.

As described above, the conventional magnetic resonance imaging apparatuses have the problem that it is not possible to obtain a high-quality, uniform image in a broad imaging region under the imaging conditions in which signals cannot be acquired at once from a wide selective excitation region or in which it is better not to widen the selective excitation region.

SUMMARY OF THE INVENTION

The present invention has been made in consideration of the above situation and has as its object to provide a magnetic resonance imaging apparatus capable of imaging a high-quality image over a broad region.

A magnetic resonance imaging apparatus according to the present invention comprises acquiring means for dispersing signal acquisition regions in an overall imaging region by shifting the signal acquisition region in a predetermined direction, and acquiring magnetic resonance signals generated from each of the signal acquisition regions; Fourier-transforming means for Fourier-transforming the magnetic resonance signals, acquired by the acquiring means, in the predetermined direction; arranging means for arranging an output of the Fourier-transforming means, in accordance with signal acquisition positions in the predetermined direction; and means for performing an image reconstruction operation for the signal components, arranged by the arranging means, in a direction other than the predetermined direction.

In the magnetic resonance imaging apparatus of the present invention, data are acquired while the position of a signal acquisition region is moved in an imaging area, and Fourier transform is first performed in this moving direction. Of the data obtained by this Fourier transform, only those corresponding to the flat portion of the selective excitation characteristics are extracted and arranged in accordance with the signal acquisition positions. Thereafter, image reconstruction processing is performed in the two remaining directions to obtain an image of the entire region. Consequently, the position dependence of the signal intensity in the moving direction decreases, and this makes it possible to obtain a high-quality image with a uniform signal intensity throughout the entire imaging region. When the present invention is applied to MR angiography, an image in which the variation in signal intensity of a blood flow signal is small can be obtained. Also, when the present invention is applied to a short-axis MRI system whose excitation region is short in the body-axis direction, it is possible to attain a continuous sagittal/coronal image or 3DFT image in a region longer than the excitation region in the body-axis direction by an imaging method in which the top plate of the bed is moved continuously not in a stepwise manner.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE PREFERRED EMBODIMENTS

A preferred embodiment of a magnetic resonance imaging apparatus according to the present invention will now be described with reference to the accompanying drawings.

First Embodiment

Figure 1:
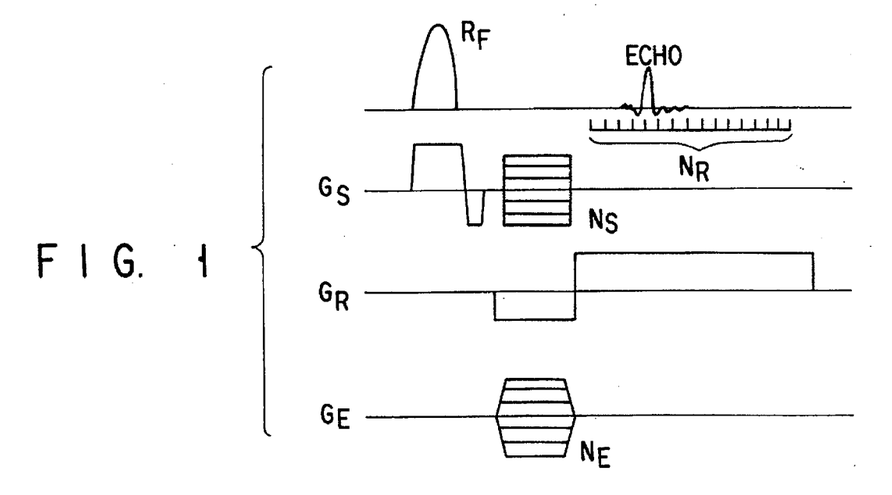
FIG. 1 is a view showing the pulse sequence of a conventional sequential 3D-FT method.
Figure 2:
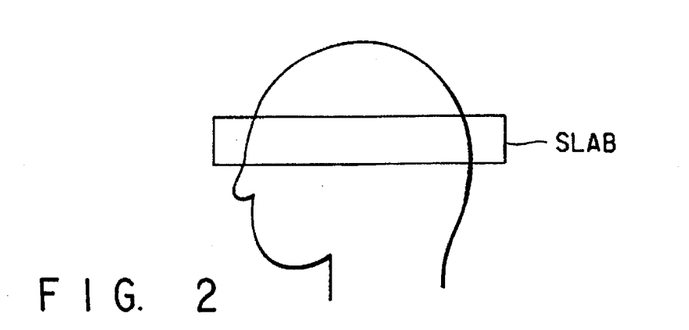
FIG. 2 is a view showing a slab which is excited by one-time imaging in the conventional sequential 3D-FT method.

The principle of the present invention will be described first in comparison with the conventional sequential multi-slab imaging method. FIG. 1 shows a pulse sequence of the sequential multi-slab imaging method performed in accordance with the general 3D-FT method. FIG. 2 shows a slab which is selectively excited (i.e., from which signals are acquired) in one-time imaging. In the 3D-FT method, the sequence in FIG. 1 is performed NE×NS times while the same region (slab) is selectively excited, and MR data (echo data) at NR points are acquired each time the sequence is executed, thereby acquiring MR data F at a total of NR×NE×NS points.

By performing image reconstruction processing using three-dimensional Fourier transform (3D-FT) for the MR data F, three-dimensional image data f of NR×NE×NS matrix is obtained. Note that the matrix sizes of the acquired data and the reconstructed image data are not necessarily the same due to oversampling during the acquisition or multiple reconstruction using shift data (e.g., Machida et al., "Maximum Value Projection MR Angiography Using Shift Data", Japan Magnetic Resonance Medical Society Journal, 12(4), pp. 183–192). However, in the present invention it is assumed that the two matrix sizes are the same.

Figure 3:
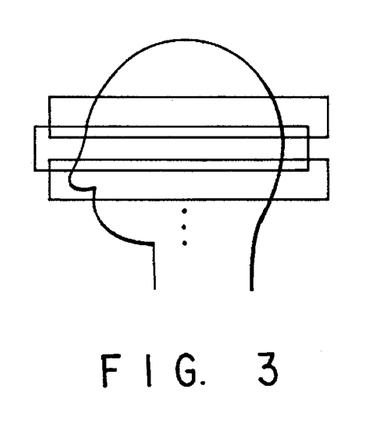
FIG. 3 is a view for explaining a conventional sequential multi-slab imaging method.
Figure 4:
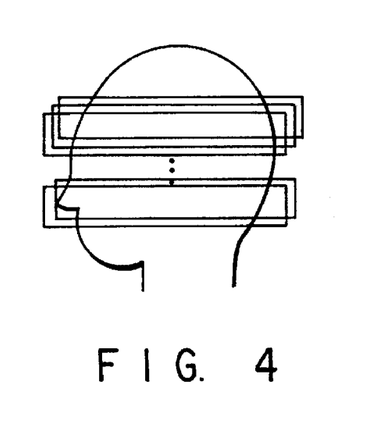
FIG. 4 is a view for explaining the imaging method of the present invention by presenting the slab excitation order in comparison with FIG. 3.

In the conventional sequential multi-slab imaging method, when signal acquisition of one slab is completed, the slab (the central position of the selective excitation region) is moved, as shown in FIG. 3, such that the slabs slightly overlap each other, and the next slab is excited. Data acquisition at NR×NE×NS points is performed in each slab, and the reconstruction processing is independently done for each slab. The multi-slab imaging method, which is a three-dimensional version of the regular multi-slice imaging method by which a plurality of slices are imaged during a repetition time TR of excitation pulses, is identical with the sequential multi-slab imaging method in that data acquisition at NR×NE×NS points is performed for each slab, and the reconstruction processing is independently done for each slab.

The method of the present invention is more or less analogous to the multi-slab imaging method, but it is characterized in that the slab is slightly moved in each encode step and imaging is performed with the slabs (selective excitation regions) uniformly distributed in an entire imaging region. That is, in the conventional method, the slab is kept excited until signals of the entire slab are completely acquired, and then the slab is moved a distance slightly smaller than the slab thickness. In contrast, in the present invention, the slab is gradually moved to allow the slab boundaries to uniformly distribute all over the imaging region. This makes a discontinuous portion of a signal imperceptible.

The following parameters are defined to formulate the method of the present invention:

NS: The resolving number in the slice direction (=the number of slices in the slab=the number of phase encode steps in the slice direction in the slab)

NS(ef): the effective number of slices used for imaging in the slice direction d: the slice thickness D: the slab thickness (=d×NS)

D(ef): the effective slab thickness (=d×NS(ef))

Figure 5:
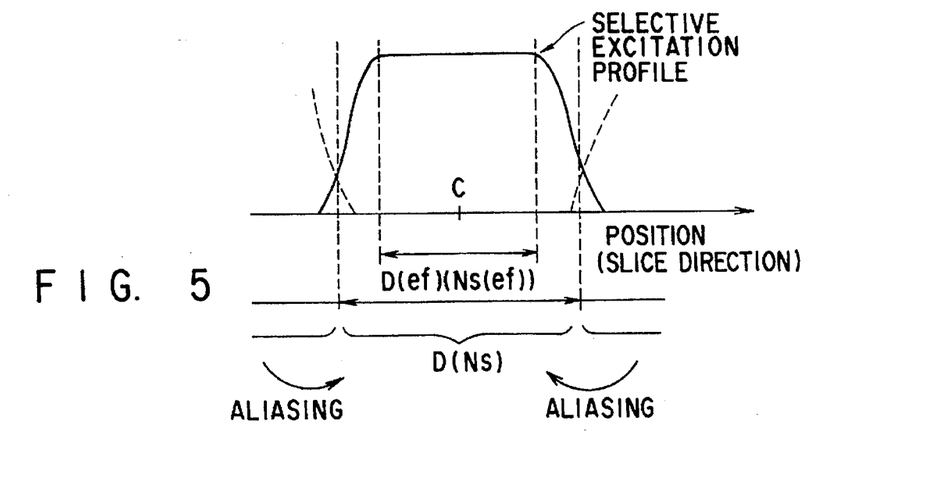
FIG. 5 is a view showing parameters necessary to formulate the movement of the excitation center according to the present invention.

C: the central position of the selective excitation region (slab) in the slice direction These parameters are illustrated in FIG. 5. Although the selective excitation profile is ideally rectangular, it slightly deform from a rectangle as in FIG. 5. The flat portion of this profile corresponds to the effective slab thickness.

In the conventional sequential multi-slab imaging method as shown in FIG. 3, in sequentially imaging B slabs from the first to the Bth slabs, a position Cb of the central slice of the bth slab is determined as follows:

$$Cb = C0 + b \times D(ef) \quad (1)$$

In this equation C0 is the central slice position of the first slab.

That is, in the conventional sequential multi-slab imaging method, the excitation center is shifted D(ef) when imaging of one slab (in which the sequence shown in FIG. 1 is executed NE×NS times) is completed.

Subsequently, NS(ef) slice images centered around Cb are extracted from the images obtained by the 3D-FT reconstruction including CPC (Centering Phase Correction) processing. An example of the CPC processing is disclosed in U.S. Pat. No. 5,084,818. Assume that the image obtained by this processing is fb (l, m, n).

The definitions of the parameters are again summarized below.

NR: The number of data acquisition points (in the read direction). Indices are i (raw data) and l (image data), and i and l=−NR/2 to (NR/2)−1.

NE: The number of encode steps. Indices are j (raw data) and m (image data), and j and m=−NE/2 to (NE/2)−1.

NS: The number of slices (=the number of encode steps in the slice direction). Indices are k (raw data) and n (image data), and k and n=−NS/2 to (NS/2)−1.

NS(ef): The number of effective slices. Indices are k (raw data) and n (image data), and n=NS(ef)' to NS(ef)'. Note that for convenience it is assumed that the number of effective slices is an odd number (i.e., NS(ef)=NS(ef)'×2+1), although the number is not necessarily an odd number.

Fb (i, j, k): Raw data of the bth slab.

fb (l, m, n): Image data of the bth slab. Assume that the image data is obtained by performing 3D-FT for the result of the CPC performed for the raw data Fb.

B: The number of slabs. Index is b (=0 to B−1).

Note that the CPC processing is to set the slab center as the matrix center after the Fourier transform, and is represented as follows:

$$Fb(i, j, k) \rightarrow Fb(i, j, k) \times exp(-2\pi\sqrt{-1}(C/D)k)$$

where n=−NS(ef)', −NS(ef)'+1, ..., 0, ..., NS(ef)' b=0, 1, ..., B−1

In contrast, in the method of the present invention, the slab (excitation center) is shifted a smaller distance than the effective slab thickness D(ef) for each encode step. However, the method is identical with the conventional method in that the slab is shifted D(ef) when one period of the encode steps elapses. That is, a position Cb,j of the central slice in the jth encode step of the bth slab is determined by the following equation:

$$Cb,j = C0 + b \times D(ef) + \sigma(j) \times d \quad (2)$$

In Equation (2), σ(j) is the function of $$\{-NE/2, \ldots, (NE/2)-1\} \rightarrow \{-NS/2, \ldots, (NS/2)-1\}$$

for determining which slice is to be imaged in each encode step. For example, functions presented below are used.

(i) If the slice center is to be linearly changed from −NS/2 to (NS/2)−1:

σ(j)=(NS(ef)/NE)×j (ii) If the slice center is to be randomly changed by choosing it at random from −NS/2 to (NS/2)−1:

σ(j)={RANDOM (j)−½}×NS(ef)

where RANDOM is the random number of [0, 1].

In either of (i) or (ii), σ(j) is the integer part of the right side.

The central position Cb,j of selective excitation depends only on b and j, i.e., it is independent of i and k. Accordingly, the position of the slab is determined when the position in the encode direction is determined in the k space.

In the present invention, the selective excitation region is determined as described above, and the data Fb(i, j, k) (i=−NR/2,..., 0,..., (NR/2)−1) are acquired while the slab is slightly moved by changing b, j, and k. There is no limitation on the method of changing b, j, and k. However, to interlock the method with the subsequent data processing, it is preferable that b and j be determined and data be acquired while the encode amount (index k) in the slice direction is changed.

CPC processing in the slice direction is performed for the acquired data {Fb(i, j, k)|k=−NS/2, ..., 0, ..., (NS/2)−1}, and Fourier transform in the slice direction is performed for the consequent data. Assume that the data subjected to the Fourier transform in the slice direction is {FbF(i, j, n)|n=−NS/2, ..., 0, ..., (NS/2)−1}. When Fourier-transformed in the slice direction, the data is decomposed in the slice direction to become data whose slice component corresponds to an actual MR image space.

Figure 6:
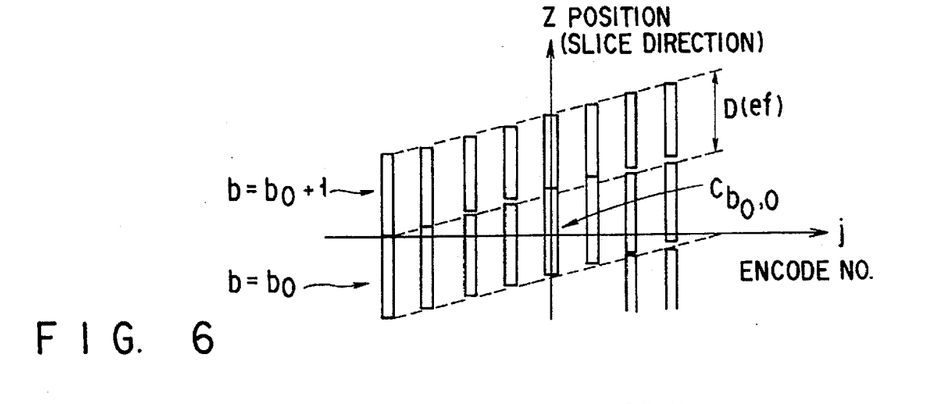
FIG. 6 is a view showing one example of the arrangement of data after Fourier transform performed only in the slice direction, which is the principle of the present invention.
Figure 7:
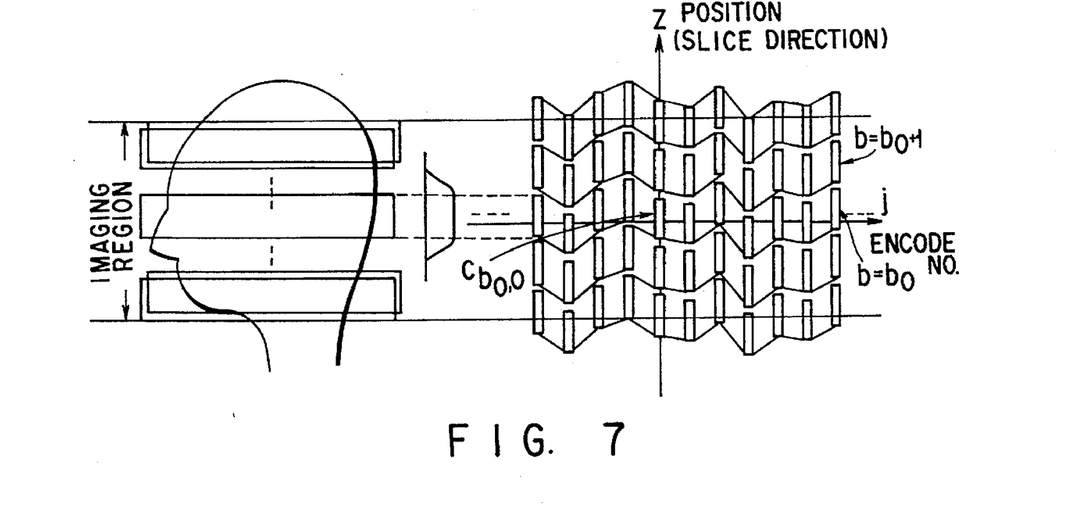
FIG. 7 is a view showing another example of the arrangement of data after the Fourier transform performed only in the slice direction, which is the principle of the present invention.

Data of the flat portion of the selective excitation profile are extracted from all of the data FbF(i, j, n) after the Fourier transform performed only in the slice direction, and are arranged in accordance with the positions in the slice direction as illustrated in FIGS. 6 and 7. FIG. 6 shows the arrangement in which the slice center is linearly changed. FIG. 7 shows the arrangement in which the slice center is randomly changed. In either case, a plurality of data having the same phase encode number j are so acquired that the sum of the data corresponding to the flat portion of the signal intensity characteristic covers the whole region in the slice direction (an actual MR image space). Assuming that the rearranged data is FF(i, j, n'), this rearrangement is represented as follows:

$$FF(i, j, n') = FbF(i, j, k)$$

where i=−NR/2, ..., (NR/2)−1 j=−NE/2, ..., (NE/2)−1 n' is determined as n'=b×NS(ef)+n and an integer between 0 to (B−1)×(NS(ef)−1)

The rearranged data is matrix data having a large size of NR×NE×(B−1)×NS(ef).

Image data fF (l, m, n) is obtained by performing Fourier transform for the data FF(i, j, n') in two directions (the read direction and the encode direction) other than the slice direction. The image data fF (l, m, n) also is matrix data of NR×NE×(B−1)×(NS(ef)−1).

Figure 8:
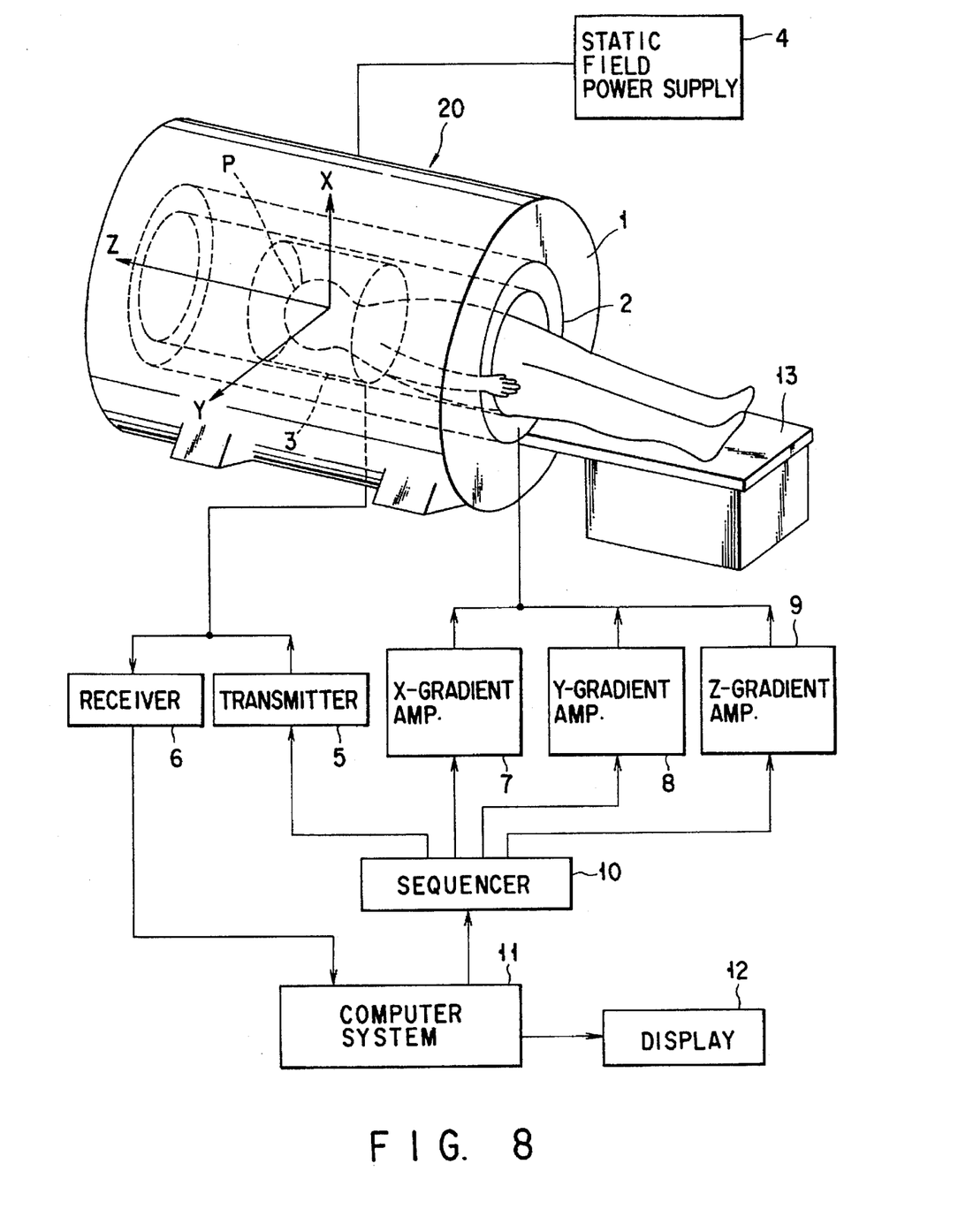
FIG. 8 is a block diagram showing a schematic arrangement of one embodiment of a magnetic resonance imaging apparatus according to the present invention.

FIG. 8 shows a schematic arrangement of one embodiment of the magnetic resonance imaging apparatus for performing the processing as described above. In a gantry 20, a static field magnet 1, an XYZ-gradient coil 2, and a transmission/reception coil 3 are provided. The transmission/reception coil 3 is illustrated as buried in the gantry 20, but it may be buried in the top plate of a bed 13. The transmission/reception coil 3 can also be directly attached to an object P to be examined. Instead of the transmission/reception coil, it is also possible to use separate coils for transmission and reception. The static field magnet 1 as a static field generator is constituted by, e.g., a superconducting coil or a normal conducting coil. The XYZ-gradient coil 2 generates an X-gradient field Gx, a Y-gradient field Gy, and a Z-gradient field Gz. The transmission/reception coil 3 generates radio-frequency (RF) pulses (a signal with a frequency corresponding to a slice position) as selective excitation pulses for selecting a slice. The transmission/reception coil 3 also detects a magnetic resonance signal (MR signal) generated by magnetic resonance. An object P to be examined (patient) placed on the top plate of the bed 13 is inserted into an imaging enable region (a spherical region in which an imaging magnetic field is produced, and only in which diagnoses are possible) in the gantry 20.

The static field magnet 1 is driven by a static field power supply 4. The transmission/reception coil 3 is driven by a transmitter 5 in exciting magnetic resonance, and coupled to a receiver 6 in detecting a magnetic resonance signal. The XYZ-gradient coil 2 is driven by an X-gradient amplifier 7, a Y-gradient amplifier 8, and a Z-gradient amplifier 9.

The X-, Y-, and Z-gradient amplifiers 7, 8, and 9 and the transmitter 5 are driven by a sequencer 10 in accordance with a predetermined sequence and generate the X-, Y-, and Z-gradient fields Gz, Gy, and Gz and the RF pulses according to a predetermined pulse sequence. The X-, Y-, and Z-gradient fields Gx, Gy, and Gz are used as a phase encode gradient field Ge, a read gradient field Gr, and a slice gradient field Gs, respectively. In addition to driving the sequencer 10, a computer system 11 receives in the magnetic resonance signal from the receiver 6 and performs a predetermined signal processing for the received signal, thereby reconstructing a tomographic image of the patient. The computer system 11 displays the tomographic image thus generated on a display 12.

In this embodiment, MR data are acquired by the pulse sequence, FIG. 1, while the frequency of the RF pulses is controlled by the sequencer 10 such that the slab position is gradually shifted in each encode step in the imaging region as indicated by equation (2). The computer system 11 first performs Fourier transform in the slice direction for the acquired data. Of the data obtained by this Fourier transform, only those corresponding to the flat portion of the selective excitation profile are arranged all over the imaging region in accordance with the slab positions, as shown in FIGS. 6 and 7. Thereafter, an image reconstruction processing is performed in the two remaining directions (the read and encode directions) only for data present at a predetermined slice position, forming a tomographic image at a desired position. An image of the entire imaging region can be obtained by performing similar processing by changing the slice position. This decreases the position dependence in the slice direction of, e.g., the signal intensity of the image. Consequently, it is possible to obtain an image with a small signal intensity variation throughout the entire imaging region.

Other embodiments of the present invention will be described below.

Second Embodiment

Although the above first embodiment is related to three-dimensional imaging, the method of the present invention is also applicable to two-dimensional imaging. In two-dimensional imaging, imaging is normally done in two directions, i.e., the read direction and the phase encode direction. That is, selective excitation is also performed in the read direction (for example, selective excitation is done in the read direction by using 180° pulses of a spin echo method). This selective excitation position in the read direction is moved in the same manner as the slice direction position in the three-dimensional imaging described above, and the acquired data are Fourier-transformed in the read direction and thereby given a position information of the real space in the read direction. The data are then arranged in accordance with the positions in the read direction and again Fourier-transformed in the remaining direction (the encode direction). The result is a final image which is long in the read direction.

Note that the selective excitation using 180° pulses of a spin echo method raises the problem that, for example, the multi-slice imaging method can no longer be performed. However, a method by which an imaging region is restricted in the read direction by using a low-pass filter, will be as described below, is also possible.

That is, by detecting an MRI signal at a certain reference frequency and passing the signal through a low-pass filter, it is possible to receive only a signal with a certain band centered around the reference frequency. This procedure can be used as the above selective excitation. Additionally, since the frequency band at which the signal is received varies when the detection frequency is shifted from the reference frequency, it is also possible to perform a manipulation corresponding to movement of the selective excitation position. Note that the frequency characteristic of this low-pass filter cannot be ideally rectangular, so a flat portion of the characteristic is limited.

Assume that

NR(ef): the number of points (a flat portion of the characteristic) actually usable in imaging in the read direction, dR: the pixel size in the read direction, and DR=dR×NR, and that the effective imaging field in the read direction is DR(ef)=dR×NR(ef). In this case, data acquisition can be performed as follows in the same manner as in the three-dimensional imaging method (the imaging in the slice direction).

That is, assume a central position Cb, j in the jth encode step of the bth selective excitation region (which corresponds to a three-dimensional slab and is an imaging region obtained by a selective excitation or through a filter) is $$Cb,j = C0 + b \times DR(ef) + \sigma(j) \times dR$$

In the above equation, $\sigma(j)$ is the function of $\{-NE/2, \ldots, (NE/2)-1\} \rightarrow \{-NR/2, \ldots, (NR/2)-1\}$ for determining which region is to be imaged in each encode step. For example, functions presented below are used.

(i) If the slice center is to be linearly changed from $-NR/2$ to $(NR/2)-1$:

$\sigma(j) = (NR(ef)/NE) \times j$ (ii) If the slice center is to be randomly changed by choosing it at random from 31 NR/2 to (NR/2)-1:

$\sigma(j) = \{RANDOM\ (j) - \frac{1}{2}\} \times NR(ef)$ where RANDOM is the random number of [0, 1].

An image can be obtained by performing Fourier transform for the obtained signals in the read direction, arranging the data on the corresponding signal acquisition positions, and again performing Fourier transform in the encode direction.

Third Embodiment

The above second embodiment is related to two-dimensional imaging. It is, however, also possible to perform similar processing in three-dimensional imaging by limiting the region in the read direction as above, although in this case the imaging efficiency is lowered.

Fourth Embodiment

In the first embodiment, in performing three-dimensional imaging, the data acquisition reconstruction is done by using Fourier transform in all of the three directions. However, although Fourier transform is necessary in the slice direction, in the two remaining directions (in the slice plane), it is also possible to perform analogous processing by using a data acquisition/reconstruction method of a back projection method.

Figure 9A:
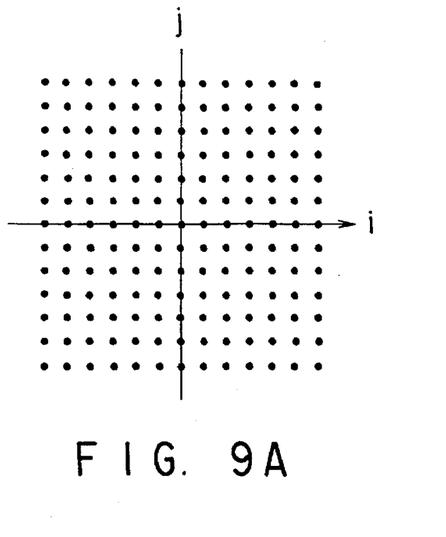
FIG. 9A is a view showing how to acquire data in the k space in a 2D-FT method.
Figure 9B:
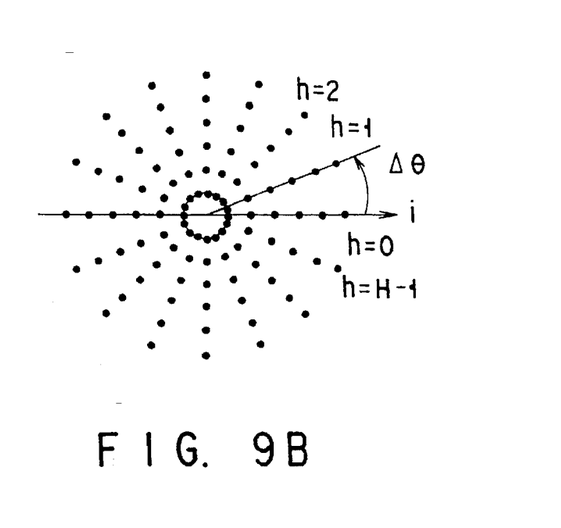
FIG. 9B is a view showing how to acquire data in the k space in a back projection method.

As an example, in the back projection method, data can be acquired and displayed as polar coordinates in the k space as illustrated in FIG. 9B. FIG. 9A shows how to acquire data in the k space in the case of the first embodiment which uses the 2D-FT method. In FIG. 9B, assuming that the index of an angular direction θ is h, data in the h·θ direction is represented by the index h.

A function τ analogous to σ described above is defined as follows:

τ: {0, 1, . . . , H−1}→{−NS/2, . . . , (NS/2)−1}

τ can be linear or random as in the case of σ.

In this case, data are acquired by setting $$C'b, h = C0 + b \times D(ef) + (NS(ef)/H) \times \tau(h) \times d$$

(where h=constant: k=−NS/2, . . . , 0, . . . , (NS/2)−1) as the center of the selective excitation. The acquired data are Fourier-transformed in the selective excitation direction, and data corresponding to the flat portion of the selective excitation profile are extracted from the result and arranged in accordance with the acquisition positions. These process steps are exactly the same as in the first embodiment. This embodiment differs from the first embodiment only in that after the data are arranged, not Fourier transform but so-called back projection processing, such as convolution, back projection, or filtered back projection, is performed in the two remaining directions, thereby imaging a final image.

The back projection method has been explained as the method of reconstruction in the two remaining directions (in the plane). However, the present invention is also applicable to any method of acquiring two-dimensional components in the k space, such as a spiral scan method by which data are spirally acquired.

Fifth Embodiment

Figure 10:
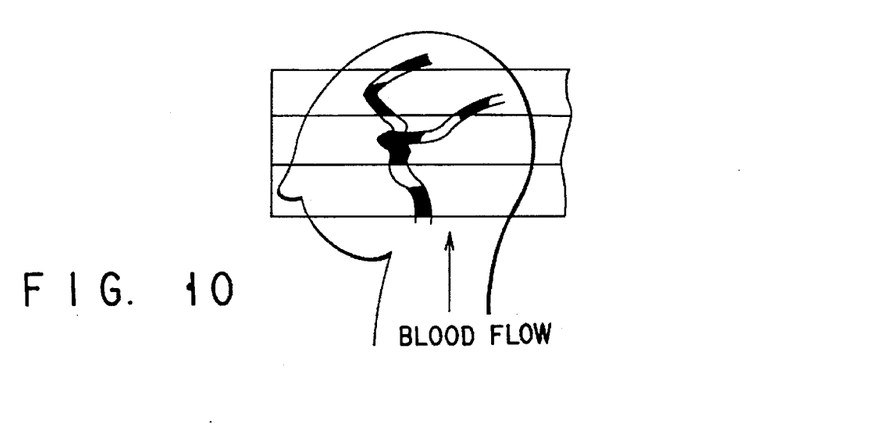
FIG. 10 is a view for explaining the problem of conventional MR angiography.

An embodiment for performing MR angiography (MRA) will be described below. The MRA includes a 3D-TOF (Time of Flight) method, a 2D-TOF method, and a sequential multi-slab method as an intermediate method between the two ("Intracranial MR Angiography: A Direct Comparison of Three Time-of-Flight Techniques", J. S. Lewin et al., American Roentgen Ray Society, AJR: 158, February 1992, pp. 381–387, 1992). Parameters (e.g., the slab thickness and the number of slabs) in the sequential multi-slab imaging method are determined by taking account of the balance between the velocity of the blood flow as an object to be examined, the inflow effect, and the S/N ratio. However, the conventional MRA has the following problem regardless of the type of the method. That is, as illustrated in FIG. 10, in each slab, the signal intensity is lowered due to a saturation effect on the downstream side of the blood flow. This results in a discontinuous signal intensity in the boundary between the slabs.

Use of the method of the present invention, however, allows the slab boundaries to distribute more uniformly, than in the case shown in FIG. 10, throughout the entire imaging region. This reduces the influence of the signal intensity variation. Note, however, that source data different in the signal intensity are used in the present invention, and, in the method by which the center of the selective excitation region is determined using the random number RANDOM, the signal intensity contains a component randomly changing in the encode direction. This component produces random ghosts in the encode direction in a final image. Fortunately, since these ghosts have the same level in the slice direction, a seamless, smooth blood flow image can be obtained, and this improves the diagnostic performance.

Sixth Embodiment

An inclined slice profile method has been proposed in which the signal intensity in a slab is kept constant by changing the flip angle in the slab ("The Design of Variable Tip Angle Slab Selection (TONE) Pulses for Improved 3-D MR Angiography", Purdy et al., Abstract Book of SMRM '92, p. 882). Unfortunately, it is not possible for this method to completely keep the signal intensity constant in an actual living body in which blood vessels whose flow velocities are different run parallel to each other in the same slab. However, the present invention can be used in combination with the inclined slice profile method since the invention is the improvement pertaining to designation of the excitation center. Consequently, the combination of the two further enhances the effect of stabilizing the signal intensity.

Seventh Embodiment

Although the TOF (Time of Flight) method has been described in the fifth embodiment, the PC (Phase Contrast) method as another representative method of the MRA can also be used together with the sequential multi-slab method. In particular, since the PC method is sensitive even to slow bloodflow, a slow blood flow can be imaged with a smooth signal intensity change when the method of the present invention for thin slabs is combined with the PC method.

Eighth Embodiment

Figure 11:
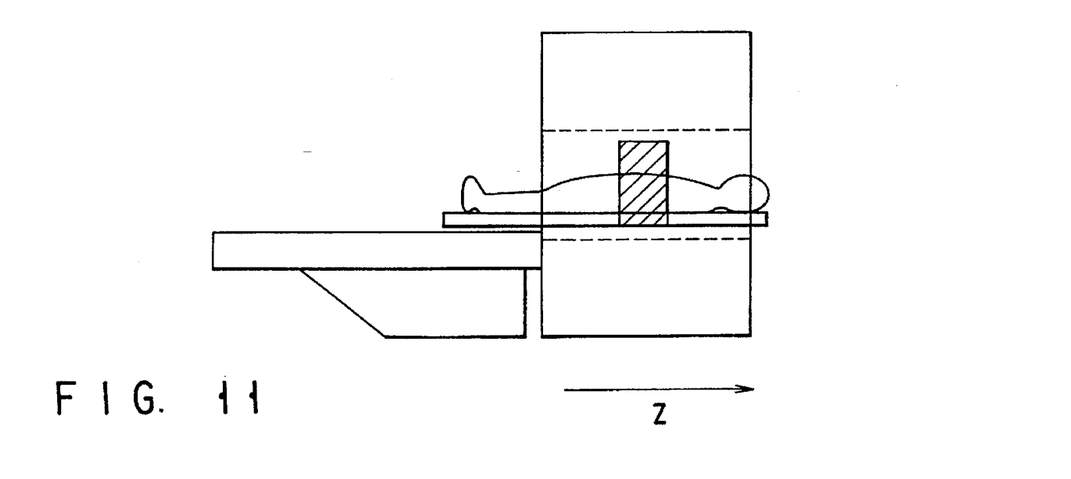
FIG. 11 is a view showing a schematic arrangement of a short-axis MRI system according to the present invention.

A short-axis MRI system will be described below. As illustrated in FIG. 11, a short-axis MRI system uses a coil having an imaging field of which length in the z-axis direction is short. In this system, sagittal/coronal imaging or 3D-FT imaging is sometimes performed in an imaging field wider than the length of the coil in the z-axis direction. For example, sagittal/coronal imaging is performed while a top plate of a bed is continuously moved during the imaging.

In imaging a field of view wider than the imaging region of the coil, the conventional approach is to move the top plate of the bed and then set the slice again after completion of the imaging of one slice. In this method, however, a slight positional deviation may occur between slice images obtained before and after the movement of the bed, or discontinuity may take place in the contrast/signal intensity, thereby interfering with the diagnosis.

Figure 12:
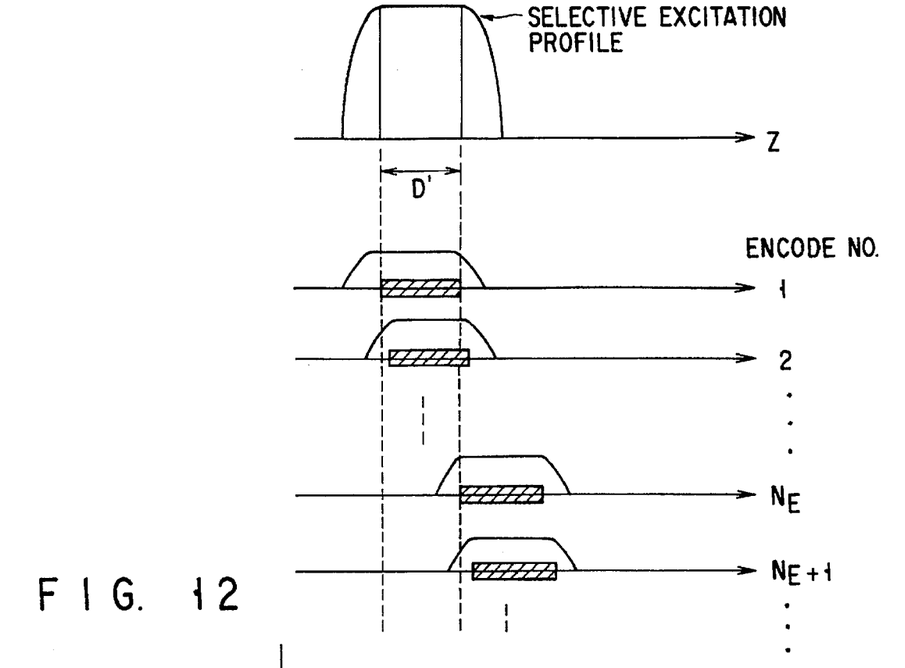
FIG. 12 is a view for explaining the operation of the short-axis MRI system in FIG. 11.
Figure 13:
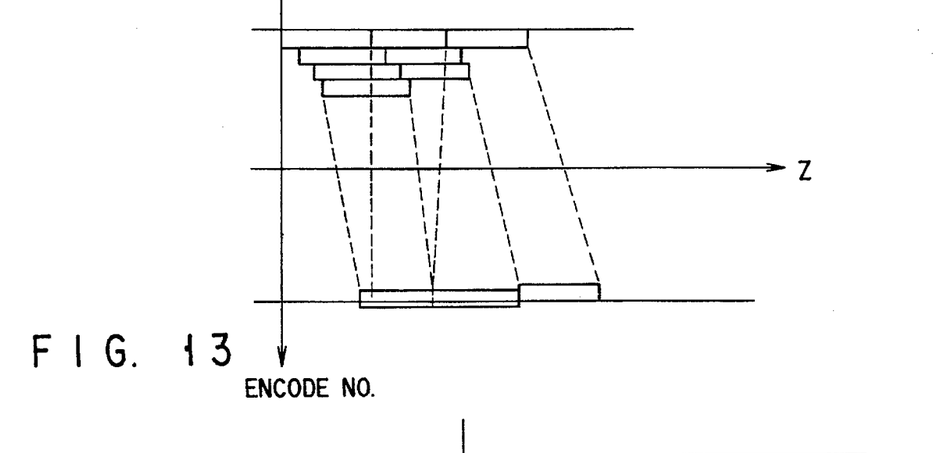
FIG. 13 is a view showing the arrangement of data after Fourier transform performed only in the read direction in the short-axis MRI system.
Figure 14:
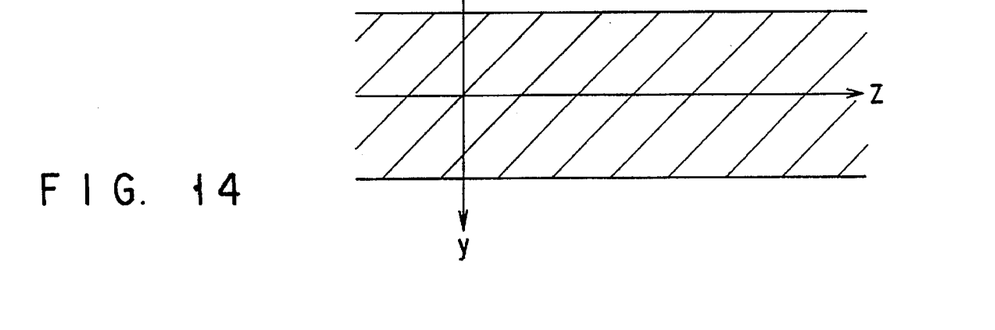
FIG. 14 is a view showing a coronal or sagittal image long in the z-axis direction, which is obtained by Fourier-transforming data, arranged as shown in FIG. 13, in the encode direction.

To prevent these inconveniences, after data are acquired while the top plate of the bed is continuously moved, processing for minimizing the discontinuity of the data is performed. More specifically, the read direction is matched with the short-axis direction, and, in moving the top plate of the bed, as illustrated in FIG. 12, data are sequentially acquired while the imaging region is shifted for each encode step. In the read direction, only data included in the imaging range of the coil and within the range (assuming the length is D') in which the selective excitation profile or the filter characteristic is flat are used. Also, the various parameters (TR: the repetition time, NA: the number of addition averagings, NE: the number of encode steps) are chosen so that the bed moves only by D' during one cycle of encode (i.e., so that (TR×NA×NE)×v=D'). As in the previous embodiments, the data thus attained are Fourier-transformed, and those corresponding to the flat portion of the selective excitation profile are extracted. The extracted data are arranged as shown in FIG. 13 and again Fourier-transformed in the encode direction (e.g., the y direction). The result is an image of a rectangular region which is infinitely long in the z direction as shown in FIG. 14.

Consequently, a continuous sagittal/coronal image can be obtained in a region longer than the imaging range in the z direction. An image long in the z direction can also be similarly obtained in the case of 3D-FT.

According to the present invention as has been described above, data are acquired while the position of a signal acquisition region is gradually moved in an entire region to be imaged. The acquired data are first Fourier-transformed in this moving direction. Of the data thus obtained by the Fourier transform, only those corresponding to the flat portion of the selective excitation profile are extracted and arranged in accordance with the signal acquisition positions. Thereafter, image reconstruction processing is performed in the two remaining directions, imaging an image of the whole region. This decreases the position dependence of the signal intensity in the slice direction. As a result, there is provided a magnetic resonance imaging apparatus capable of imaging a high-quality image with a uniform signal intensity throughout the entire imaging region. When the present invention is applied to MR angiography, an image in which the degree of the discontinuity of blood flow signals is small can be attained. Also, when the present invention is applied to a short-axis MRI system in which the imaging range in the z-axis direction is short, it is possible to obtain a continuous sagittal/coronal image or 3D-FT image in a region longer than the imaging region in the z-axis direction.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A magnetic resonance imaging apparatus comprising:
   acquiring means for acquiring magnetic resonance signals generated from a signal acquisition region while shifting the signal acquisition region in a predetermined direction to disperse signal acquisition regions in an overall imaging region;
   Fourier-transforming means for Fourier-transforming the magnetic resonance signals, acquired by said acquiring means, in the predetermined direction;
   arranging means for arranging an output of said Fourier-transforming means in accordance with signal acquisition positions in the predetermined direction; and
   means for performing an image reconstruction operation for the signal components, arranged by said arranging means, in a direction other than the predetermined direction.

2. An apparatus according to claim 1, wherein said arranging means comprises
   extracting means for extracting, from an output of said Fourier-transforming means, signal components corresponding to a flat portion of a signal intensity characteristic in the predetermined direction; and
   means for arranging the signal components, extracted by said extracting means, in accordance with signal acquisition positions in the predetermined direction.

3. An apparatus according to claim 2, wherein the predetermined direction is a frequency encode direction, and a plurality of magnetic resonance signals having the same phase encode amount are so acquired that the sum of the signal components corresponding to the flat portion of the signal intensity characteristic covers the overall imaging region in the frequency encode direction.

4. An apparatus according to claim 2, wherein said acquiring means uses a data acquisition method in which the predetermined direction is a slice direction and two remaining directions cover a two-dimensional k space, and acquires a plurality of magnetic resonance signals having the same phase encode amount so that the sum of the signal components corresponding to the flat portion of the signal intensity characteristic covers the whole region in the slice direction.

5. An apparatus according to claim 4, wherein said acquiring means acquires the magnetic resonance signals while linearly changing the phase encode amount in the k space.

6. An apparatus according to claim 4, wherein said acquiring means acquires the magnetic resonance signals while randomly changing the phase encode amount in the k space.

7. An apparatus according to claim 2, wherein the predetermined direction is a first phase encode direction, two remaining directions are a second phase encode direction and a frequency encode direction, and a plurality of magnetic resonance signals having the same second phase encode amount are so acquired that the sum of the signal components corresponding to the flat portion of the signal intensity characteristic covers the whole region in the first phase encode direction.

8. An apparatus according to claim 7, wherein said acquiring means acquires the magnetic resonance signals while linearly changing the second phase encode amount in a k space.

9. An apparatus according to claim 7, wherein said acquiring means acquires the magnetic resonance signals while randomly changing the second phase encode amount in a k space.

10. An apparatus according to claim 1, wherein said acquiring means acquires the magnetic resonance signals while linearly changing a phase encode amount in a k space.

11. An apparatus according to claim 1, wherein said acquiring means acquires the magnetic resonance signals while randomly changing a phase encode amount in a k space.

12. An apparatus according to claim 1, wherein said acquiring means acquires the magnetic resonance signals in accordance with a pulse sequence of a sequential multi-slab imaging method for MR angiography.

13. An apparatus according to claim 12, wherein said acquiring means determines the signal acquisition region by selective excitation, and acquires the magnetic resonance signals in accordance with a pulse sequence by which a flip angle is changed depending on a position in a selective excitation direction so that a blood flow signal becomes uniform in a selective excitation region.

14. An apparatus according to claim 1, wherein said acquiring means acquires the magnetic resonance signals for a region which is wider than an imaging region of an MRI system which is mainly determined in accordance with a length of a magnet by moving a top plate of a bed.

15. A magnetic resonance imaging apparatus comprising:
   acquiring means for selectively exciting a slab which is thick in a slice direction, giving phase encode information and frequency encode information to generated magnetic resonance signals, and acquiring the magnetic resonance signals, a slice position $Cb,j$ of a selective excitation center being set as follows in accordance with a phase encode j:

$$Cb,j = C0 + b \times D + \sigma(j) \times d$$

where C0 is the initial value, b is 0 to B−1 and is a positional index of the slabs, D is the slab thickness, d is the slice thickness, and, when the slice position of the selective excitation center is to be linearly changed from $-NS/2$ to $(NS/2)-1$ in one cycle of the phase encode of $-NE/2$ to $(NE/2)-1\sigma(j)$ is the following function:

$$\sigma(j)=(NS/ME)\times j$$

where NE is the number of encodes in one cycle and NS is the number of slices in one slab;

Fourier-transforming means for Fourier-transforming the magnetic resonance signals, acquired by said acquiring means, in the slice direction, and giving information of a phase encode amount and a slice position to the magnetic resonance signals acquired in units of slabs; and means for performing image reconstruction operations in a frequency encode direction and a phase encode direction for signals which are included in the output from said Fourier-transforming means and have the same slice position.

16. A magnetic resonance imaging apparatus comprising:

acquiring means for selectively exciting a slab which is thick in a slice direction, giving phase encode information and frequency encode information to generated magnetic resonance signals, and acquiring the magnetic resonance signals, a slice position $Cb,j$ of a selective excitation center being set as follows in accordance with a phase encode j:

$$Cb,j=C0+b\times D+\sigma(j)\times d$$

where CO is the initial value, b is 0 to B–1 and is a positional index of the slabs, D is the slab thickness, d is the slice thickness, and, when the slice position of the selective excitation center is to be linearly changed from $-NS/2$ to $(NS/2)-1$ in one cycle of the phase encode of $-NE/2$ to $(NE/2)-1\sigma(j)$ is the following function:

$$\sigma(j)=(RANDOM(j)-\tfrac{1}{2})\times NS$$

where RANDOM is the random number of [0,1], NE is the number of encodes in one cycle, and NS is the number of slices in one slab;

Fourier-transforming means for Fourier-transforming the magnetic resonance signals, acquired by said acquiring means, in the slice direction, and giving information of a phase encode amount and a slice position to the magnetic resonance signals acquired in units of slabs; and means for performing image reconstruction operations in a frequency encode direction and a phase encode direction for signals which are included in the output from said Fourier-transforming means and have the same slice position.

17. A magnetic resonance imaging apparatus comprising:

acquiring means for selectively exciting a region of a slice in a read direction, giving phase encode information to generated magnetic resonance signals, and acquiring the magnetic resonance signals, a read position $Cb,j$ of a selective excitation center being set as follows in accordance with a phase encode j:

$$Cb,j=C0+b\times D+\sigma(j)\times d$$

where CO is the initial value, b is 0 to B–1 and is a positional index of the slabs, D is a thickness of a selective excited region in the read direction, d is a pixel size in the read direction, and, when the read position of the selective excitation center is to be linearly changed from $-NR/2$ to $(NR/2)-1$ in one cycle of the phase encode of $-NE/2$ to $(NE/2)-1\sigma(j)$ is the following function:

$$\sigma(j)=(NS(ef)/NE)\times j$$

where NE is the number of encodes in one cycle and NS(ef) is an effective number of slices;

Fourier-transforming means for Fourier-transforming the magnetic resonance signals, acquired by said acquiring means, in the read direction, and giving information of a read position to the magnetic resonance signals acquired in units of the selective excitation regions; and means for performing image reconstruction operations in a phase encode direction for signals output from said Fourier-transforming means.

18. A magnetic resonance imaging apparatus comprising:

acquiring means for selectively exciting a region of a slice in a read direction, giving phase encode information to generated magnetic resonance signals, and acquiring the magnetic resonance signals, a read position $Cb,j$ of a selective excitation center being set as follows in accordance with a phase encode j:

$$Cb,j=C0+b\times D+\sigma(j)\times d$$

where CO is the initial value, b is 0 to B–1 and is a positional index of the slabs, D is a thickness of a selective excited region in the read direction, d is a pixel size in the read direction, and, when the read position of the selective excitation center is to be linearly changed from $-NR/2$ to $(NR/2)-1$ in one cycle of the phase encode of $-NE/2$ to $(NE/2)-1\sigma(j)$ is the following function:

$$\sigma(j)=RANDOM\,(j)-\tfrac{1}{2})\times NS(ef)$$

where RANDOM is the random number of [0, 1] and NS(ef) is an effective number of slices:

Fourier-transforming means for Fourier-transforming the magnetic resonance signals, acquired by said acquiring means, in the read direction, and giving information of a read position to the magnetic resonance signals acquired in units of the selective excitation regions; and means for performing image reconstruction operations in a phase encode direction for signals output from said Fourier-transforming means.

\* \* \* \* \*